(12) United States Patent
Crowley

(10) Patent No.: US 6,841,051 B2
(45) Date of Patent: Jan. 11, 2005

(54) HIGH-POWER ION SPUTTERING MAGNETRON

(75) Inventor: Daniel T. Crowley, Owatonna, MN (US)

(73) Assignee: Sputtering Components, Inc., Livermore, CA (US)

(*) Notice: Subject to any disclaimer, the term of this patent is extended or adjusted under 35 U.S.C. 154(b) by 0 days.

(21) Appl. No.: 10/763,627

(22) Filed: Jan. 23, 2004

(65) Prior Publication Data

US 2004/0149576 A1 Aug. 5, 2004

Related U.S. Application Data

(63) Continuation of application No. 10/098,559, filed on Mar. 14, 2002, now abandoned.

(51) Int. Cl.[7] .................................................. C23C 14/35
(52) U.S. Cl. ........................ 204/298.22; 204/298.21
(58) Field of Search .......................... 204/298.2, 298.21, 204/298.22, 298.23, 298.11

(56) References Cited

U.S. PATENT DOCUMENTS

| | | |
|---|---|---|
| 4,179,351 A | 12/1979 | Hawton, Jr. et al. |
| 4,356,073 A | 10/1982 | McKelvey |
| 4,422,916 A | 12/1983 | McKelvey |
| 4,443,318 A | 4/1984 | McKelvey |
| 4,445,997 A | 5/1984 | McKelvey |
| 4,466,877 A | 8/1984 | McKelvey |
| 4,824,540 A | 4/1989 | Stuart |
| 5,096,562 A | 3/1992 | Boozenny et al. |
| 5,100,527 A | 3/1992 | Stevenson et al. |
| 5,200,049 A | 4/1993 | Stevenson et al. |
| 5,814,195 A | 9/1998 | Lehan et al. |

*Primary Examiner*—Rodney G. McDonald
(74) *Attorney, Agent, or Firm*—Moore, Hansen & Sumner

(57) ABSTRACT

A high-power ion sputtering magnetron having a rotary cathode comprising a conducting member disposed within the rotary cathode being made of an electrically conductive material for conducting electrical current from the power supply to the rotary cathode. The ion sputtering magnetron also has an electromagnetic field shield disposed between the conducting member and the drive shaft portion. The field shield is made of an electromagnetic field-permeable material such as a ferrous material for reducing damage to parts adjacent to the conducting member that are susceptible to inductive magnetic heating.

17 Claims, 3 Drawing Sheets

HIGH-POWER ION SPUTTERING MAGNETRON

CROSS REFERENCE TO RELATED APPLICATIONS

This application is a continuation of U.S. patent application Ser. No. 10/098,559 to Crowley which was filed on Mar. 14, 2002 now abandoned.

BACKGROUND OF THE INVENTION

This invention relates generally to thin film coating deposition devices. More particularly, the present invention relates to shielded rotary cathodes for use in high-powered ion sputtering magnetrons.

Rotary or rotating cylindrical cathodes were developed to overcome some of the problems associated with planar magnetrons. Examples of the rotating cathode are further described in U.S. Pat. Nos. 4,356,073 and 4,422,916, the entire disclosures of which are hereby incorporated by reference. Various mounting, sealing and driving arrangements for cylindrical cathodes are described in U.S. Pat. Nos. 4,443,318; 4,445,997; 4,466,877, the entire disclosures of which are hereby incorporated by reference. Those patents describe rotating cathodes mounted horizontally in a coating chamber supported at both ends. It is often preferable to support the rotary cathode at only one end by a cantilever mount such as described in U.S. Pat. No. 5,200,049, the disclosure of which is also hereby incorporated by reference.

In recent years, the sputter coating industry has moved toward high-power sputtering. Manufacturers of such devices have been providing higher powers to the sputtering equipment to provide the end-user with increasing rates of coating material sputtered from the cathodes ultimately to increase plant productivity. With these advances have come the important problems of equipment failure due to magnetic inductive heating of parts. Manufacturing plant line shut-downs caused by such failure are extremely expensive because significant downtime and repair costs are required to fix damaged equipment. Ion sputtering magnetrons utilizing high-power alternating current are susceptible to such damage and failure from magnetic inductive heating of its sensitive parts.

For example, a rotary cathode used in an ion sputtering magnetron is susceptible to seizure from a number of failure modes. As alternating current and frequency increase, parts in the sputtering magnetron become more susceptible to heat damage. Rotation stoppage of the rotary cathode can be due to bearing seizure either in the main bearings or the rotary seal bearings. Failure can also be due to rotary seal leakage caused by overheating. Still another failure can be insulation breakdown due to exposure to overheated neighboring parts. Inductive heating is greatly magnified in ferro-magnetic materials that make up most bearings and the primary parts of the preferred rotary seal, namely, the ferrous fluid seal. Consequently, another significant failure point is the rotary seal which is susceptible to being easily damaged from excessive inductive heating. Additional failure modes with this rotary seal include seizure and atmospheric leakage which will shut down the sputtering process and, consequently, the manufacturing line, at great cost.

Another significant problem encountered is when the target material of a rotary cathode sputters mostly at one end of the target at the point where electricity from the drive shaft connects to the target. This causes non-uniform coatings on the product that need to be compensated for by masking or other problematic or expensive means. Shutting down the manufacturing line to replace those rotary cathode targets is also very costly.

Still another problem caused by high power is resistive heating. Resistive heating of parts in the current path also limits the power that can be applied.

Yet another problem is shorting and arcing at higher powers and voltages due to conductive dust from the electrical brushes that bridges insulators inside existing cathode design.

Thus, there is a need in the art for providing a high-powered ion sputtering magnetron which is less susceptible to heat damage caused by magnetic inductive heating to increase plant productivity.

BRIEF SUMMARY OF THE INVENTION

Currently, it is an object of this invention to provide an improved rotary cathode for thin film coating deposition devices, such as ion sputtering magnetrons for shielding sensitive parts in the sputtering magnetron from magnetic inductive heating damage to increase plant productivity.

An advantage to the present invention is that it simplifies design and eliminates the need for running utilities to both end supports, thereby eliminating the need for additional power, coolant, drive, rotary seals and all the other accompanying air-to-vacuum seals.

Another advantage is that this design eliminates resistive heating as the entire power train is directly water-cooled. This allows greatly increased power on the conductors in the cathode.

Still another advantage of the invention is that it shields heat-sensitive parts by absorbing fluctuating magnetic fields and blocks electrical noise.

Yet another invention advantage is that the electrical brushes are placed inside the cathode cooling system where dust is flushed out and cannot bridge insulators inside the cathode thereby reducing incidents of shorting and arcing. Because these brushes are internal to the cathode, the brushes could be distributed evenly inside the target allowing a more uniform power distribution and therefore providing more uniform target wear and a more uniform coating and deposition on the product. However, the brushes could be disposed anywhere inside the cathode cooling system, such as inside the cathode drive shaft.

The rotary cathode device for an ion sputtering magnetron of the present invention comprises a conducting member disposed within the rotary cathode device. The conducting member is made of an electrically conductive material for conducting electrical current from the power supply to the rotary cathode device. The conducting member is preferably a coolant conduit.

The rotary cathode device further comprises a drive shaft portion which includes an interior surface and an exterior surface. The drive shaft portion is further made of an electromagnetic field-permeable material such as a ferrous material.

In other embodiments of the invention, the drive shaft need not be made of any particular material, but instead, an electromagnetic field shield is disposed between the conducting member and the drive shaft portion with the shield being made of an electromagnetic field-permeable material. For example, in another preferred embodiment of the invention, the electromagnetic field shield is attached to at least a portion of the interior surface of the drive shaft portion or the shield is made of electromagnetic field-permeable material.

In another preferred embodiment of the invention, the electromagnetic field shield is attached to at least a portion of the exterior surface of the drive shaft portion with the shield being made of an electromagnetic field-permeable material. A rotary cathode device, connectable to a power supply of electrical current, comprises a coolant conduit disposed within the rotary cathode device made of an electrically conductive material for conducting electrical current from the power supply to the rotary cathode. Also, a drive shaft portion is made of a ferrous material for absorbing the electromagnetic field to reduce the heat damage to parts adjacent to the rotary cathode device that are susceptible to magnetic heating.

Also provided is a high-powered ion sputtering magnetron which is connectable to a power supply of electrical current. The magnetron device comprises a rotary cathode disposed upon the magnetron device. The rotary cathode comprises a conducting member disposed within the rotary cathode. The conducting member is made of an electrically conductive material for connecting the electrical current from the power supply to the rotary cathode.

In one preferred embodiment, a high-power ion sputtering magnetron comprises a rotary cathode rotatably mounted upon the magnetron device. The rotary cathode comprises a conducting member disposed within the rotary cathode. The conducting member is made of electrically conductive material for conducting the electrical current from the power supply to the rotary cathode. The magnetron device further comprises a drive shaft portion rotatably mounted to the magnetron device. The drive shaft portion is made of a ferrous material for absorbing the electromagnetic field to reduce heat damage to parts adjacent to the rotary cathode device that are susceptible to inductive magnetic heating.

BRIEF DESCRIPTION OF THE DRAWINGS

Other objects, common features and advantages of the present inventions will become more fully apparent from the following detailed description of preferred embodiment, the appended claims and the accompanying drawings in which:

DESCRIPTION OF THE PREFERRED EMBODIMENTS

To assist in the understanding of the preferred embodiments illustrated in the FIGS. 1 through 5, it will be assumed that Magnetic shielding materials entrap magnetic flux at various locations such as at the magnetic flux source or shield a sensitive component. The optimum shielding strategy and shield location typically involve performance, complexity of design, and cost considerations. A passive shielding strategy is a type of magnetic shielding strategy which relies on the interactions between magnetic fields and special high permeability materials.

The dynamic interactions between AC and DC magnetic fields and their role in a passive shielding strategy may involve six parameters: frequency, attenuation, saturation, magnetic field strength, magnetic flux density and material permeability.

The magnetic field strength, called the "H" field, describes the intensity of a magnetic field in free space at some distance away from its source. Field strength (H), measured in Oersteds (Oe), is a function of the intensity of the magnetic source and the distance from the source from which it is measured.

Magnetic flux density, called the "B" field, describes the concentration of magnetic lines of force in a material. Flux density (B) and Gauss (G) measures the number of magnetic lines of force that reside in a square centimeter of material. The flux density depends on intensity of a magnetic source, the distance of the material from the magnetic source, and the material's attractiveness to the magnetic fields.

Material permeability, indicated by the Greek symbol $\mu$ (Mu), refers to a material's ability to attract and conduct magnetic lines of flux. The more conductive a material is to magnetic fields, the higher its permeability. The formula $\mu=B/H$ shows that the permeability of a material can be determined by measuring the magnetic field strength (H) at a point in free space and then measuring the flux density (B) at that point after the insertion of a material. The higher the permeability of the material, the greater the concentration of the flux lines will be.

Figure 1:
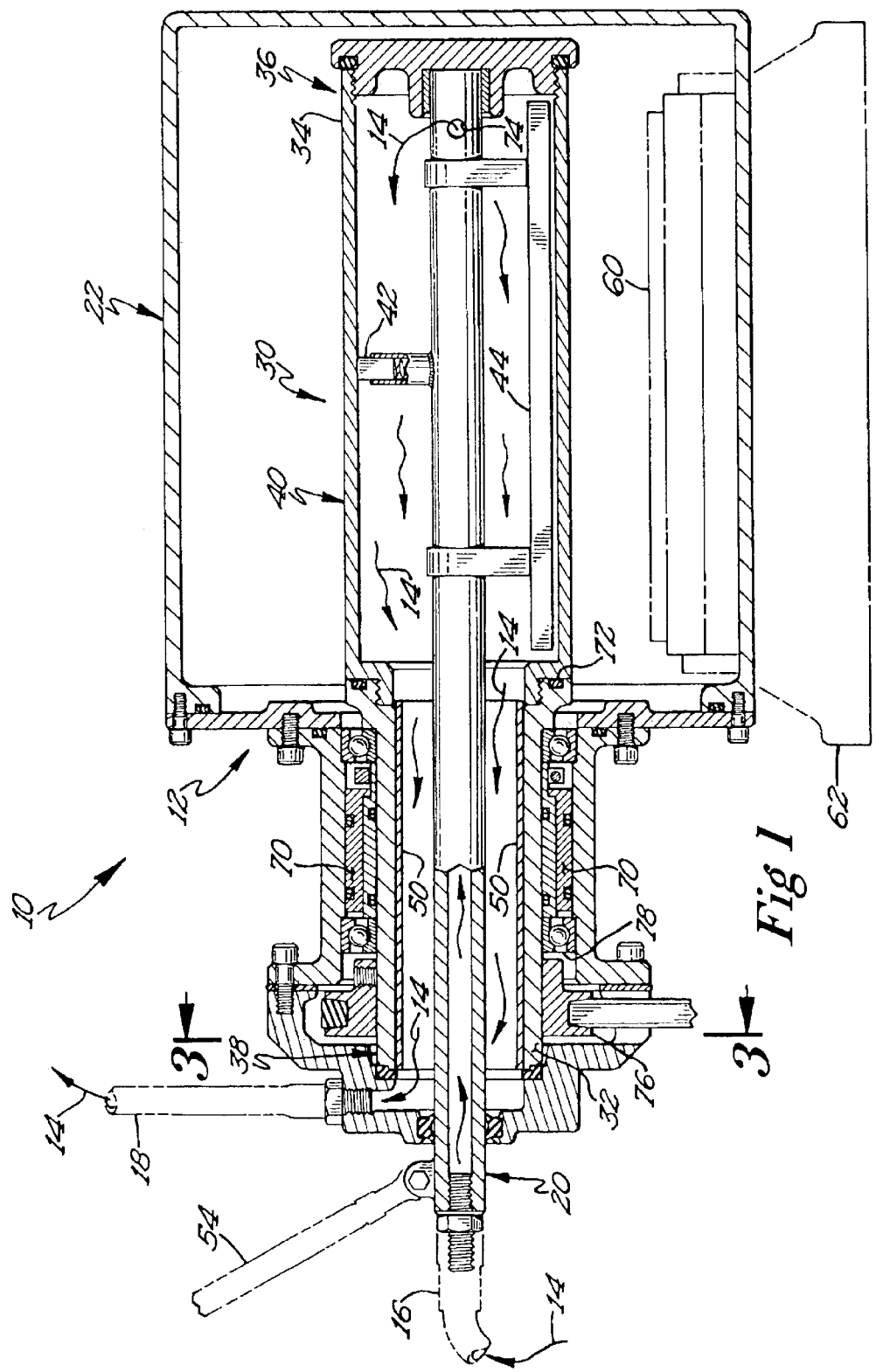
FIG. 1 is a cross-sectional view of a first preferred embodiment of the invention showing the rotary cathode with a magnetic field permeable shield affixed to the drive shaft interior as installed in the high-powered ion sputtering magnetron incorporating a cantilever-style rotary cathode.

A first preferred embodiment of the present invention is illustrated by example in FIG. 1 showing a cantilever-style rotary cathode with a magnetic field permeable material fixed to the interior of the drive shaft. A high-power ion sputtering magnetron 10 includes a frame 12 as shown in FIG. 1.

Mostly recessed inside the frame 12 is a cooling system. Coolant 14 in the form preferably of de-ionized water is transported from a coolant supply (not shown) to a coolant inlet 16. A coolant conduit 20 is connected at one end to the coolant inlet 16 and at the other end to a coolant outlet 18. The coolant conduit 20 is made of electrically conductive material. The flow direction can be designed to go either way as desired, such as from the coolant outlet 18 through the coolant conduit 20 and out the coolant inlet 16.

A vacuum chamber 22 is attached to the frame 12 of the high power ion sputtering magnetron 10. Rotary vacuum seal 70 and static vacuum seals 72 are used in conjunction with a vacuum pump (not shown) to create a vacuum in the vacuum chamber 22.

An inert gas system is also incorporated into the ion sputtering magnetron 10. Inert gas, such as Argon (not shown) is transmitted from a gas supply (not shown) to a gas injection means (not shown). The inert gas is finally transferred into the vacuum chamber 22 to facilitate the sputtering process.

A rotary cathode device, such as a rotary cathode 30, is rotatably mounted upon the ion sputtering magnetron 10. The cylindrical-shaped cathode 30 includes a first end 32 and a second end 34. FIG. 1 shows a cantilever-style 36 mounting of the cathode 30. The first end 32 is supported while the second end 34 is unsupported in the cantilever-style mounting of the cathode 30. The rotary cathode 30 comprises a drive shaft portion 38 and a target portion 40. The drive shaft portion 38 includes an interior surface and an exterior surface. The drive shaft portion 38 may be integral with or rigidly attached to the target portion 40.

A conducting member, such as the coolant conduit 20, is disposed longitudinally within the rotary cathode 30, specifically within the drive shaft portion 38 and the target portion 40. The coolant conduit 20 is made of an electrically conductive material connecting an electrical current from the power source to the rotary cathode 30. A rotary electrical contact 42, preferably an electrical brush assembly 42, connects the coolant conduit 20 with the target portion 40. A magnet array 44 depends from the coolant conduit 20 to near the interior surface of the target portion 40.

Figure 2:
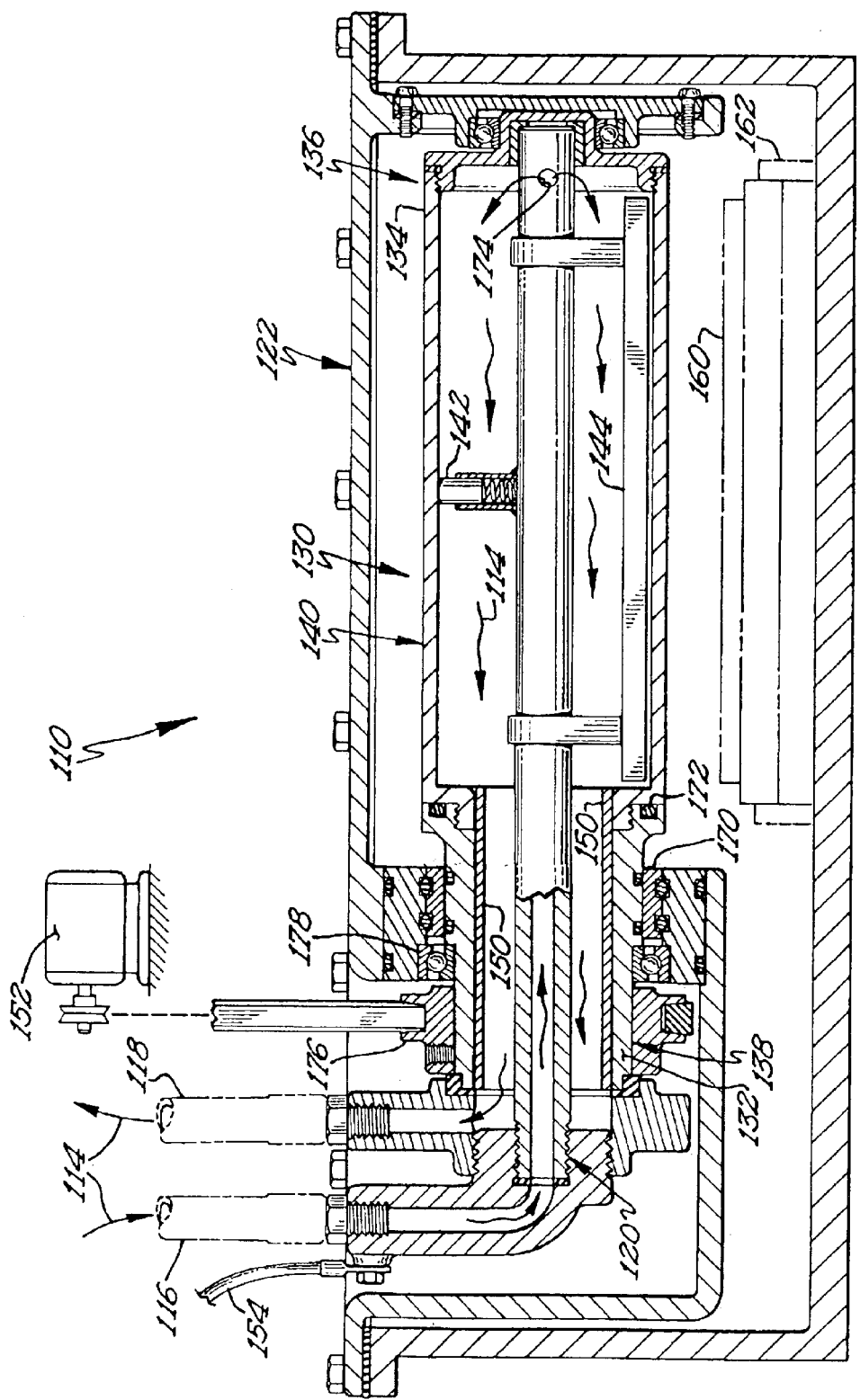
FIG. 2 is a cross-sectional view of a first preferred embodiment of the invention showing the rotary cathode with a magnetic field permeable shield affixed to the drive shaft interior as installed in the high-powered ion sputtering magnetron in the form of a double-ended support style rotary cathode.
Figure 3:
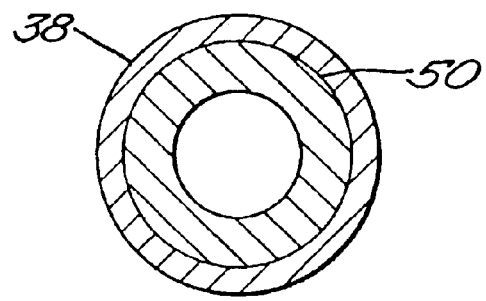
FIG. 3 is a side elevational, cross-sectional view of a first preferred embodiment of the invention showing the drive shaft with the magnetic field permeable material fixed to the interior of the drive shaft.

The rotary cathode 30 further comprises an electromagnetic field shield 50 attached to at least a portion of the interior surface of the drive shaft portion 38. The electromagnetic field shield 50 is made of an electromagnetic field-permeable material such as a ferrous material or the like. The electromagnetic field shield 50 is disposed between the conducting members such as the coolant conduit 20 and the drive shaft portion 38. FIGS. 1, 2, and 3 show the electromagnetic field shield 50 attached to at least a portion of the interior surface of the drive shaft portion 38. Preferably, the electromagnetic field shield 50 is cylindrical in shape and extends the entire length of the drive shaft portion 38.

Mounted to the frame 12 of the sputtering magnetron 10 is a motor (not shown), which is of conventional design known in the art. Optionally, the motor is connected to a gear reducer (not shown). A drive connector (not shown), such as a drive belt, chain or gearing, transmits power from the motor to the drive shaft portion 38 of the rotary cathode 30. The drive shaft portion 38 is integral with or is rigidly attached to the target portion 40 such as by a threaded engagement to each other.

An electrical power supply (not shown) is connectable to a power supply cable 54 of the sputtering magnetron 10. The other end of the power supply cable 54 is connected to the coolant conduit 20. The electrical brush assembly 42 conducts electricity from the coolant conduit 20 to the target portion 40. It will be appreciated by those skilled in the art that this rotary electrical contact 42 can be disposed anywhere inside the sputtering magnetron 10 such that it electrically couples the coolant conduit 20 to any component electrically connected to the target portion 40.

In a single cathode system, generally using direct current power, the anode (not shown) is a structure electrically connected to the positive side of the power supply. Preferably, the anode is inserted into, sealed and insulated from the vacuum chamber 22. The anode floats at a potential greater than the rotary cathode 30. Alternatively, the anode structure can also be the coater itself at ground potential. In that case, the anode structure is again greater than the rotary cathode 30 potential. The anode should be accessible to the electrons emitted from the rotary cathode 30.

In a tandem rotary cathode 30 system utilizing alternating current power, generally no separate anode structure is used. A power supply cable 54 connected to the power supply is attached to a rotary cathode 30. One rotary cathode 30 acts as the anode while the other rotary cathode 30 functions as the cathode. Each rotary cathode in the tandem cathode system alternates functions as a current switches directions.

In operation, coolant 14 from a coolant supply (not shown) is directed to the coolant inlet 16. Coolant then is directed through the coolant conduit 20 and out a conduit aperture 74 adjacent to the second end 34 of the rotary cathode 30. The coolant 14 then flows from the target portion 40 interior into the drive shaft portion 38 interior for providing the additional advantage of cooling the electromagnetic field shield 50 before exiting through the coolant outlet 18. The flow direction can be designed to go either way as desired, such as from the coolant outlet 18 through the coolant conduit 20 and out the coolant inlet 16.

From the target portion 40, electrons in the course of completing a circuit, leave the negatively charged rotary cathode 30 and are attracted to the positively charged anode. The electrons are then trapped in a magnetic field created by the magnet array assembly 44. The electrons are repelled by the rotary cathode 30 while simultaneously being pulled toward the rotary cathode 30 by magnetic field lines (not shown). An ion cloud or plasma is formed between the magnetic array assembly 44 and the substrate 60. In that plasma area, magnetic field lines carrying electrons intersect inert gas molecules such as argon and the electrons ionize the gas molecules. The positively charged ions in the plasma accelerate toward the negatively charged target portion 40 and knock off atoms from the target material located on the target portion 40. Finally, those free atoms from the target material are deposited on the substrate 60. The product is a coated substrate 60 such as a glass window.

The portion of the stationary, electrically conductive coolant conduit 20 within the drive shaft portion 38 creates an electromagnetic field that produces inductive heating. The electromagnetic field shield 50 protects heat-sensitive components of the ion sputtering magnetron 10 such as the rotary seal and static seals. Consequently, the parts susceptible to heat damage and contribute to rotary cathode 30 failure are then protected, reducing extensive replacement time and part costs.

The present invention provides an improved high-powered ion sputtering magnetron which can be operated longer and less expensively by fewer rotary cathode replacements and when a repair does become necessary, the rotary cathode replacement is faster and easier than preexisting ones. The ion sputtering magnetron has a simple and reliable electromagnetic field shield which protects other heat-sensitive parts of the ion sputtering magnetron and from inductive heat damage. Thus, the ion sputtering magnetron of the present invention has the important advantage of providing longer useful production to the owner and operator thereof.

By redirecting the electricity through the empty interior of the drive shaft, along a conducting member such as the coolant conduit, electricity is directed to internal rotary electrical contacts and, therefore, to the target. One advantage of the feature is to provide a place for a magnetic field shield between the coolant conduit and the drive shaft. Another advantage is to provide cooling of that magnetic field shield which is susceptible magnetic inductive heating. This shield feature protects heat-sensitive parts by absorbing fluctuating magnetic field that induces heating. Other advantages include a directly cooled power train that allows for higher input power; reduced shorting and arcing events inside the cathode; more uniform coating and less frequent cathode target changes. The field shield provides an additional advantage of blocking electrical noise from the conducting member and/or coolant conduit.

A second preferred embodiment of the present invention is illustrated by way of example in FIG. 2 showing a double-ended support-style rotary cathode in an ion sputtering magnetron with a magnetic field permeable material affixed to the outside of the drive shaft. A high-power ion sputtering magnetron 110 includes a frame 112 as shown in FIG. 2.

A cooling system expands into the frame 112. Coolant 114 in the form preferably of de-ionized water is transported from a coolant supply (not shown) to a coolant inlet 116. A coolant conduit 120 is connected at one end to the coolant inlet 116 and at the other end to a coolant outlet 118. The coolant conduit 120 is stationary and is made of electrically conductive material. The flow direction can be designed to go either way as desired, such as from the coolant outlet 118 through the coolant conduit 120 and out the coolant inlet 116. The coolant inlet 116 and the coolant outlet 118 are shown running parallel to each other at the top of the frame 112.

A vacuum chamber 122 is attached to the frame 112 of the high power ion sputtering magnetron 110. Vacuum seals including a vacuum rotary seal 170 and vacuum static seals 172 are used in conjunction with a vacuum pump (not shown) to create a vacuum in the vacuum chamber 122.

An inert gas system is also incorporated into the ion sputtering magnetron 110. Inert gas, such as argon (not shown) is transmitted from a gas supply (not shown) to a gas injection means (not shown). The inert gas is directed into the vacuum chamber 122 facilitates charged ions in the sputtering process.

A rotary cathode device, such as a rotary cathode 130 is rotatably mounted upon the ion sputtering magnetron 110. The cylindrical-shaped cathode 130 includes a first end 132 and a second end 134. FIG. 2 shows a two-end support-style 136 mounting of the rotary cathode 130. Both the first end 132 is supported and the second end 134 is also supported. The rotary cathode 130 comprises a drive shaft portion 138 integral with or rigidly attached to a target portion 140. The drive shaft portion 38 includes an interior surface and an exterior surface. With this invention, utilities running to both ends of the rotary cathode are no longer necessary.

A conducting member, such as the coolant conduit 120, is disposed longitudinally within the rotary cathode 130, specifically within the drive shaft portion 138 and the target portion 140. The coolant conduit 120 is made of an electrically conductive material connecting an electrical current from the power source to the rotary cathode 130. An electrical brush assembly 142 connects the coolant conduit 120 with the target portion 140. It will be appreciated by those skilled in the art that this electrical connection also can be made via other components inside the magnetron 110 that are electrically connected to the target portion 140. A magnet array 144 depends from the coolant conduit 120 to near the interior surface of the target portion 140.

The rotary cathode 130 further comprises an electromagnetic field shield 150 attached to at least a portion of the interior surface of the drive shaft portion 138. The electromagnetic field shield 150 is made of an electromagnetic field-permeable material such as a ferrous material or the like. The electromagnetic field shield 150 is disposed between the conducting members such as the coolant conduit 120 and the drive shaft portion 138. FIGS. 1, 2, and 3 show the electromagnetic field shield 150 attached to at least a portion of the interior surface of the drive shaft portion 138. Preferably the electromagnetic field shield 150 is cylindrical in shape and extends the entire length of the drive shaft portion 138.

A motor 152 which is of conventional design known in the art is mounted to the frame 112 of the sputtering magnetron 110. Optionally, the motor 152 is connected to a gear reducer (not shown). A drive connector (not shown), such as a drive belt, chain or gearing, transmits power from the motor 152 to the drive shaft portion 138 of the rotary cathode 130. The drive shaft portion 138 may be integral with or rigidly attached to the target portion 140 such as by a threaded engagement to each other or the like.

An electrical power supply (not shown) is connected to a power supply cable 154 of the sputtering magnetron 110. The other end of the power supply cable 154 is connected to the coolant conduit 120. The electrical brush assembly 142 conducts electricity from the coolant conduit 120 to the target portion 140.

In operation, coolant 114 from a coolant supply (not shown) is directed to the coolant inlet 116. Coolant then is directed through the coolant conduit 120 and out a conduit aperture adjacent to the second end 134 of the rotary cathode 130. The coolant 114 then flows from the target portion 140 interior into the drive shaft portion 138 interior for providing the additional advantage of cooling the electromagnetic field shield 150 before exiting through the coolant outlet 118. The flow direction can be designed to go either way as desired, such as from the coolant outlet 118 through the coolant conduit 120 and out the coolant inlet 116.

The electromagnetic field shield 150 protects heat-sensitive components of the ion sputtering magnetron 110 such as the rotary seal and static seals from the electromagnetic field that produces inductive heating. Consequently, the parts susceptible to heat damage and contribute to rotary cathode 130 failure are then protected, reducing extensive replacement time and part costs.

The significant benefit to such a configuration here is that all utilities can be fed into just one end support in this dual-support-style cathode configuration. This simplifies its design and gives the added advantage of eliminating the utilities normally directed to the other end support of the magnetron, such as additionally eliminating power, coolant or drive, and a rotary seal and all the other accompanying air-to-vacuum seals. The importance of eliminating one of the two rotary seals can be appreciated by the fact that rotary seal failure can be one of the most frequent causes of cathode failure, so eliminating one of these two rotary seals in the magnetron will reduce the need for such repairs by 50%. Similarly, this design eliminates one of the two sets of air-to-vacuum seals in the magnetron which will reduce the need for such repairs with the resulting ultimate benefit of significantly improved sputtering magnetron reliability and improved plant productivity.

Figure 4:
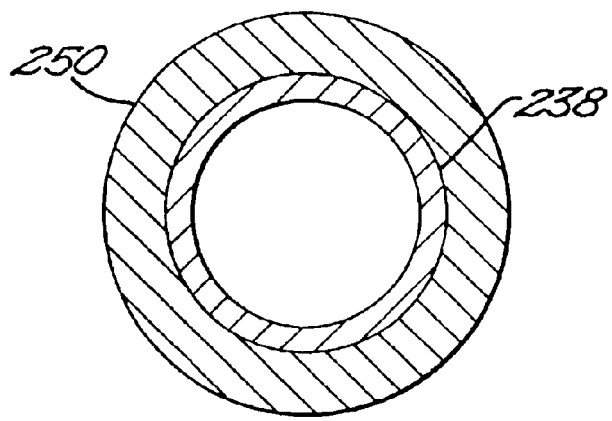
FIG. 4 is a side elevational, cross-sectional view of a second preferred embodiment of the rotary cathode invention showing the magnetic field permeable material fixed around the exterior of the drive shaft.

A second preferred embodiment of the rotary cathode device invention is illustrated in FIG. 4. Electromagnetic field shield 250 surrounds the exterior of the drive shaft 238.

Figure 5:
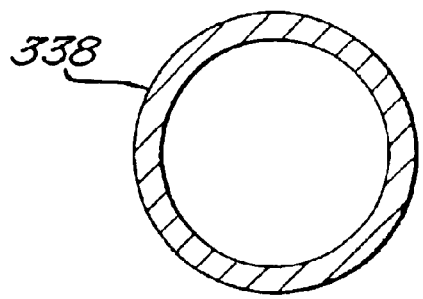
FIG. 5 is a side elevational, cross-sectional view of a third preferred embodiment of the rotary cathode invention showing the drive shaft itself being made of a magnetic field permeable material without an additional shield.

A third preferred embodiment of the rotary cathode device invention is shown in FIG. 5. This embodiment can be used in any style, such as the cantilever style or the two-ended support style. The invention eliminates the need for an additional electromagnetic field shield by making the drive shaft itself 338 be made of electromagnetic field-permeable material, such as a ferrous material.

While the present invention has been disclosed in connection with the preferred embodiment thereof, it should be understood that there may be other embodiments which fall within the spirit and scope of the invention as defined by the following claims.

What is claimed is:

1. A rotary cathode device, comprising:
   a conducting member disposed within a rotary cathode for coupling electrical current from a power supply to a brush assembly, the conducting member being made of an electrically conductive material; and an electromagnetic field shield disposed between the conducting member and an outer surface of the rotary cathode.

2. A rotary cathode device of claim 1 wherein the conducting member comprises a coolant conduit.

3. A rotary cathode device of claim 1 the electromagnetic field shield forms at least part of a drive shaft portion of the rotary cathode.

4. A rotary cathode device of claim 1 wherein the electromagnetic field shield comprises electromagnetic field-permeable material.

5. A rotary cathode device of claim 1 further comprising a drive shaft portion of the rotary cathode, the electromagnetic field shield being disposed between the conducting member and the drive shaft portion.

6. A rotary cathode device of claim 5 wherein the drive shaft portion has a bore passing there through such that the drive shaft portion includes an interior surface adjacent the bore, the electromagnetic field shield being adjacent to at least a portion of the interior surface of the drive shaft portion.

7. A rotary cathode device of claim 1 further comprising a drive shaft portion of the rotary cathode which forms at least a portion of the outer surface of the rotary cathode, the electromagnetic field shield being adjacent to at least a portion of an outer surface of the drive shaft portion.

8. A high-power ion sputtering magnetron having a rotary cathode device of claim 1.

9. A rotary cathode device connectable to a power supply of electrical current, said rotary cathode device comprising:

a coolant conduit disposed within the rotary cathode device made of an electrically conductive material for connecting the electrical current from the power supply to the rotary cathode; and a drive shaft portion made of a ferrous material for absorbing the electromagnetic field to reduce heat damage to parts adjacent to the coolant conduit that are susceptible to inductive magnetic heating.

10. A high-power ion sputtering magnetron, comprising:

a rotary cathode disposed upon the magnetron device, the rotary cathode comprising a conducting member disposed within the rotary cathode for coupling electrical current from a power supply to a brush assembly, the conducting member being made of an electrically conductive material, the rotary cathode further comprising an electromagnetic field shield disposed between the conducting member and an outer surface of the rotary cathode.

11. A magnetron device of claim 10 wherein the conducting member comprises a coolant conduit.

12. A magnetron device of claim 10 wherein the electromagnetic field shield forms at least part of a drive shaft portion of the rotary cathode rotatably disposed upon the magnetron device.

13. A magnetron device of claim 10 wherein the electromagnetic field shield comprises electromagnetic field-permeable material.

14. A magnetron device of claim 10 wherein the rotary cathode further comprises a drive shaft portion of the rotary cathode, the electromagnetic field shield being disposed between the conducting member and the drive shaft portion.

15. A magnetron device of claim 14 wherein the rotary cathode drive shaft portion has a bore passing there through such that the drive shaft portion includes an interior surface adjacent the bore, the electromagnetic field shield being adjacent to at least a portion of the interior surface of the drive shaft portion.

16. A magnetron device of claim 10 wherein the rotary cathode further comprises a drive shaft portion of the rotary cathode which forms at least a portion of the outer surface of the rotary cathode, the electromagnetic field shield being adjacent to at least a portion of an outer surface of the drive shaft portion.

17. A high-power ion sputtering magnetron connectable to an electrical power supply, said magnetron device comprising:

a rotary cathode rotatably mounted upon the magnetron device, said rotary cathode comprising a conducting member disposed within the rotary cathode, said conducting member being made of an electrically conductive material for connecting the electrical current from the power supply to the rotary cathode; and a drive shaft portion rotatably mounted to the magnetron device, said drive shaft portion being made of a ferrous material for absorbing the electromagnetic field to reduce heat damage to parts adjacent to the conducting member that are susceptible to inductive magnetic heating.

* * * * *